United States Patent
Onuma

(10) Patent No.: US 11,293,983 B2
(45) Date of Patent: Apr. 5, 2022

(54) ERROR RATE MEASURING APPARATUS AND SETTING SCREEN DISPLAY METHOD

(71) Applicant: ANRITSU CORPORATION, Kanagawa (JP)

(72) Inventor: Hiroyuki Onuma, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 17/176,437

(22) Filed: Feb. 16, 2021

(65) Prior Publication Data
US 2021/0302500 A1    Sep. 30, 2021

(30) Foreign Application Priority Data
Mar. 24, 2020  (JP) .............................. JP2020-052351

(51) Int. Cl.
| | | |
|---|---|---|
| *G01R 31/319* | (2006.01) | |
| *G06F 3/0484* | (2022.01) | |
| *G01R 31/317* | (2006.01) | |
| *G06F 3/04847* | (2022.01) | |

(52) U.S. Cl.
CPC ... *G01R 31/31905* (2013.01); *G01R 31/3171* (2013.01); *G06F 3/04847* (2013.01)

(58) Field of Classification Search
None
See application file for complete search history.

(56) References Cited

U.S. PATENT DOCUMENTS

| | | | | |
|---|---|---|---|---|
| 7,809,996 | B2* | 10/2010 | Cioffi | H04M 11/062 |
| | | | | 714/704 |
| 10,587,374 | B2* | 3/2020 | Iwai | H04L 1/203 |
| 10,749,615 | B2* | 8/2020 | Kidokoro | H04L 25/4917 |
| 2021/0273744 | A1* | 9/2021 | Tsuyuki | H04L 1/203 |
| 2021/0273745 | A1* | 9/2021 | Tsuyuki | H04L 1/0045 |
| 2021/0286662 | A1* | 9/2021 | Onuma | G06F 11/1048 |
| 2021/0293883 | A1* | 9/2021 | Onuma | G01R 31/318569 |
| 2021/0303428 | A1* | 9/2021 | Onuma | H04L 27/02 |

FOREIGN PATENT DOCUMENTS

JP     2007-274474 A     10/2007

* cited by examiner

*Primary Examiner* — Jermele M Hollington
(74) *Attorney, Agent, or Firm* — Pearne & Gordon LLP

(57) ABSTRACT

Provided is a technique for achieving improvement of usability in setting parameters. An error rate measuring apparatus includes a display unit that displays input boxes for inputting one Codeword length and one FEC Symbol length of FEC on a setting screen, and an operation unit that inputs the one Codeword length and the one FEC Symbol length to the corresponding input boxes according to a communication standard of a device under test. A graphic of one Codeword, a graphic of one FEC Symbol, and a graphic of one Codeword including an error for identifying a configuration relationship of an FEC Symbol to a Codeword of the FEC and a correspondence relationship of an FEC Symbol Error to the Codeword are displayed on the setting screen corresponding to the input box of each of the one Codeword length and the one FEC Symbol length of the FEC.

4 Claims, 7 Drawing Sheets

ERROR RATE MEASURING APPARATUS AND SETTING SCREEN DISPLAY METHOD

TECHNICAL FIELD

The present invention relates to an error rate measuring apparatus that transmits a known pattern (non return to zero (NRZ) signal or pulse amplitude modulation 4 (PAM4) signal) as a test signal to a device under test in a state in which the device under test has transited to a state of a signal pattern return and measures a bit error rate of input data returned and received from the device under test in compliance with the transmission of the test signal, and in particular, measures whether or not a forward error correction (FEC) operation of the device under test is possible, and a setting screen display method.

BACKGROUND ART

For example, as disclosed in Patent Document 1 described below, an error rate measuring apparatus is hitherto known as an apparatus that transmits a test signal of a known pattern including fixed data to a device under test and compares a signal under test returned and received from the device under test in compliance with the transmission of the test signal with a reference signal to be a reference in units of bits to measure a bit error rate (BER)

Incidentally, in a case where a PAM is particularly used as the test signal, while a large amount of transmission can be realized compared to NRZ, an Eye opening is small, and thus, a signal to noise ratio (SNR) is damaged compared to the NRZ. For this reason, as the number of symbols increases, the influence of noise also becomes large, and it is extremely difficult to make errors zero. Therefore, it is desirable to count FEC Symbol Errors that occur in a region according to a communication standard according to the device under test to be measured and to measure whether or not error correction based on forward error correction (FEC) is possible.

RELATED ART DOCUMENT

Patent Document

[Patent Document 1] JP-A-2007-274474

DISCLOSURE OF THE INVENTION

Problem that the Invention is to Solve

However, in the error rate measuring apparatus of the related art, in measuring the propriety of the error correction based on the FEC described above, the user simply inputs various parameters, such as a manner of dividing data and a manner of inputting a threshold value for an error, only with numerical values, and there is a problem in that what kinds of various parameters are reflected in data cannot be recognized, causing degradation of usability.

Accordingly, the invention has been accomplished in view of the above-described problem, and an object of the invention is to provide an error rate measuring apparatus and a setting screen display method capable of achieving improvement of usability in setting parameters.

Means for Solving the Problem

To achieve the above-described object, there is provided an error rate measuring apparatus 1 according to a first aspect of the invention that inputs a non return to zero (NRZ) signal or a pulse amplitude modulation 4 (PAM4) signal of a known pattern including an error as a test signal to a device under test W, receives a signal from the device under test compliant with the input of the test signal, and measures whether or not a forward error correction (FEC) operation of the device under test is possible based on a comparison result of the signal received from the device under test and the test signal. The error rate measuring apparatus includes:

an operation unit 4 that inputs a setting parameter to the signal received from the device under test; and a display unit 6 that displays the setting parameter on a setting screen 11.

The display unit displays input boxes 13 and 15 for inputting one Codeword length and one FEC Symbol length of the FEC as the setting parameter to the signal received from the device under test on the setting screen 11, the operation unit 4 inputs the one Codeword length and the one FEC Symbol length of the FEC to the corresponding input boxes according to a communication standard of the device under test, and at least one of a graphic 12 of one Codeword, a graphic 12a or 14 of one FEC Symbol, and a graphic 12b, 16, or 17 of one Codeword including an error for identifying a configuration relationship of an FEC Symbol to a Codeword of the FEC and a correspondence relationship of an FEC Symbol Error to the Codeword is displayed on the setting screen corresponding to the input box of each of the one Codeword length and the one FEC Symbol length of the FEC.

According to a second aspect of the invention, in the error rate measuring apparatus of the first aspect, a plurality of preset settings, in which the one Codeword length and the one FEC Symbol length of the FEC are set in advance according to the communication standard of the device under test W, are displayed on the setting screen 11 in a selectable manner, and one preset setting is selected and set from among the plurality of preset settings by the operation unit 4.

According to a third aspect of the invention, there is provided a setting screen display method for an error rate measuring apparatus that inputs a non return to zero (NRZ) signal or a pulse amplitude modulation 4 (PAM4) signal of a known pattern including an error as a test signal to a device under test (W), receives a signal from the device under test compliant with the input of the test signal, measures whether or not a forward error correction (FEC) operation of the device under test is possible based on a comparison result of the signal received from the device under test and the test signal, inputs a setting parameter to the signal received from the device under test, and displays the setting parameter on a setting screen 11. The setting screen display method for an error rate measuring apparatus includes a step of displaying input boxes 13 and 15 for inputting one Codeword length and one FEC Symbol length of the FEC as the setting parameter to the signal received from the device under test on the setting screen 11, a step of inputting the one Codeword length and the one FEC Symbol length of the FEC to the corresponding input boxes according to a communication standard of the device under test through the input, and a step of displaying at least one of a graphic 12 of one Codeword, a graphic 12a or 14 of one FEC Symbol, and a graphic 12b, 16, or 17 of one Codeword including an error for identifying a configuration relationship of an FEC Symbol to a Codeword of the FEC and a correspondence relationship of an FEC Symbol Error to the Codeword on the setting screen corresponding to the input box of each of the one Codeword length and the one FEC Symbol length of the FEC.

According to a fourth aspect of the invention, the setting screen display method for an error rate measuring apparatus according to the third aspect further includes a step of displaying a plurality of preset settings, in which the one Codeword length and the one FEC Symbol length of the FEC are set in advance according to the communication standard of the device under test W, on the setting screen 11 in a selectable manner, and a step of selecting and setting one preset setting from among the plurality of preset settings.

Advantage of the Invention

According to the invention, it is possible to allow the user to set the respective parameters (Codeword and FEC Symbol) of the FEC to the signal received from the device under test after visually recognizing the configuration relationship of the FEC Symbol to the Codeword of the FEC or the correspondence relationship of the FEC Symbol Error to the Codeword through the graphic display even though the user is not an expert who knows the communication standard of the device under test, and to achieve improvement of usability.

BEST MODE FOR CARRYING OUT THE INVENTION

Hereinafter, a mode for carrying out the invention will be described in detail referring to the accompanying drawings.

An error rate measuring apparatus according to the invention transmits a test signal of a known pattern to a device under test in a state in which the device under test has transited to a state of signal pattern return and measures an error rate of a received signal returned from the device under test in compliance with the transmission of the test signal.

Figure 1:
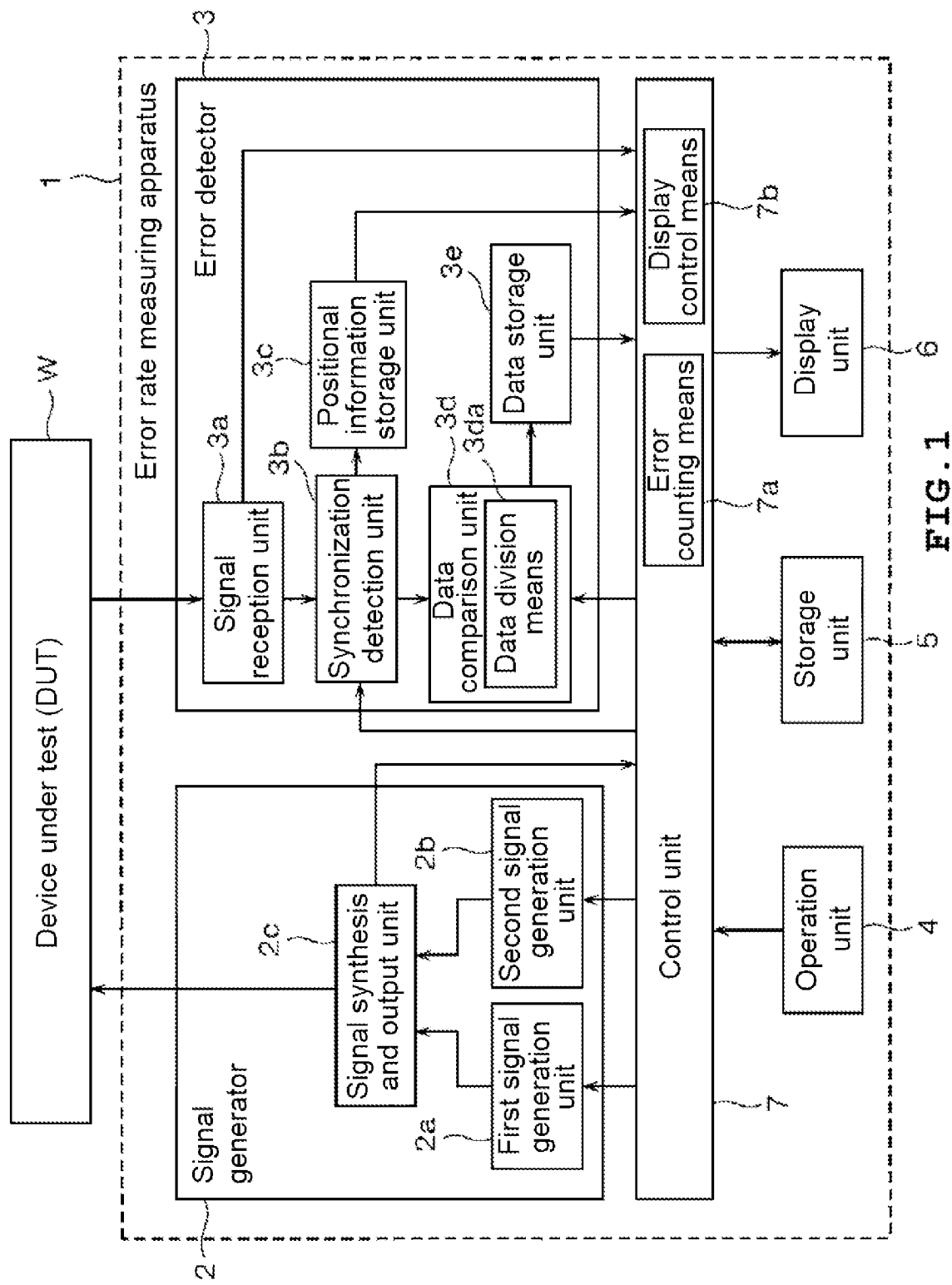
FIG. 1 is a block diagram showing the schematic configuration of an error rate measuring apparatus according to the invention.

As shown in FIG. 1, an error rate measuring apparatus 1 of an embodiment has a function of measuring whether or not a forward error correction (FEC) operation of a device under test W is possible based on a comparison result of a received signal from the device under test W when an NRZ signal of a known pattern with an inserted error or a PAM4 signal having four symbol values is input as a test signal to the device under test W, and the test signal, and schematically includes a signal generator 2, an error detector 3, an operation unit 4, a storage unit 5, a display unit 6, and a control unit 7.

In the embodiment, the configuration and processing content for realizing the function of measuring whether or not the FEC operation of the device under test W is possible is primarily described.

The signal generator 2 generates, as reference data based on a multi-value signal, an NRZ signal in a system in which there is no return to zero between bits or a PAM4 signal formed of desired symbol string data (data of a string of symbols having symbol values of 0, 1, 2, 3).

In a case of generating the PAM4 signal, as shown in FIG. 1, the signal generator 2 schematically includes a first signal generation unit 2a, a second signal generation unit 2b, and a signal synthesis and output unit 2c.

Figure 2:
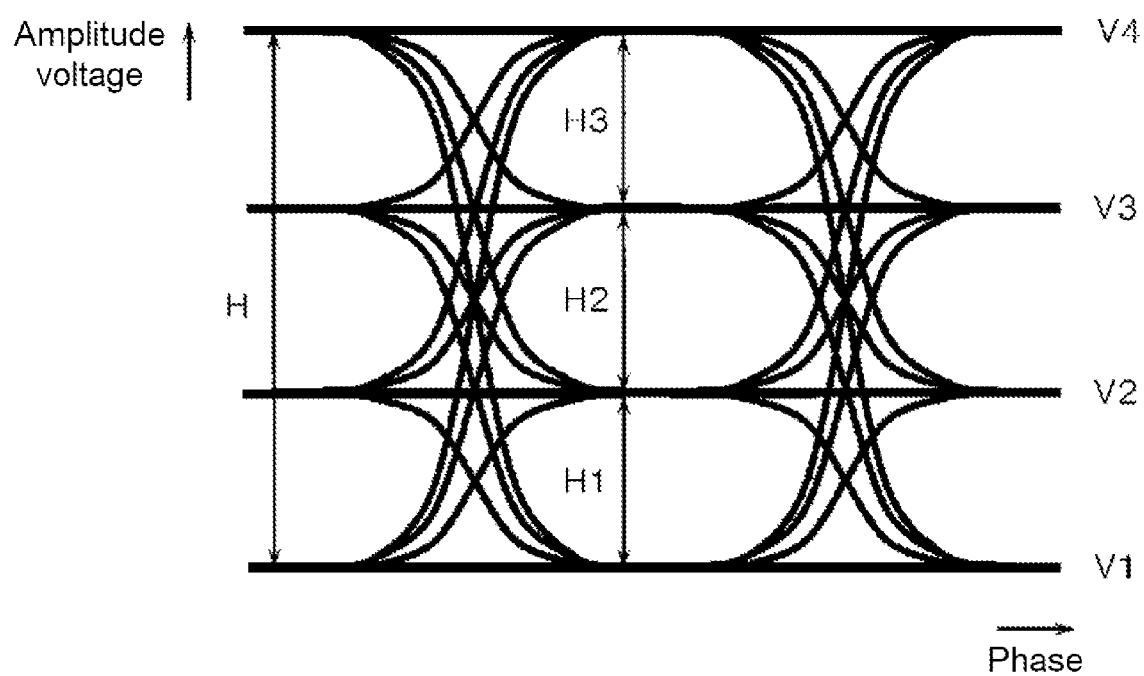
FIG. 2 is an explanatory view of a PAM4 signal.

The PAM4 signal has amplitude that is divided into four kinds for each symbol, as shown in FIG. 2 and has four different voltage levels V1, V2, V3, and V4 of amplitude. An entire amplitude voltage range H is divided into a low voltage range H1, a medium voltage range H2, and a high voltage range H3 in an ascending order of the voltage levels, and is formed of consecutive ranges based on three eye pattern openings.

Upon generating a desired PAM4 symbol string in a known pattern including fixed data, the first signal generation unit 2a generates a most significant bit (MSB) string signal that is added to a least significant bit (LSB) string signal to be generated by the second signal generation unit 2b to generate the PAM4 signal.

The second signal generation unit 2b generates the least significant bit string signal that is added to the most significant bit string signal generated by the first signal generation unit 2a to generate the PAM4 signal.

Examples of specific bit string signals that are generated by the first signal generation unit 2a and the second signal generation unit 2b include periodic patterns, such as various pseudo random patterns (Pseudo Random Bit Sequence (PRBS)) including PRBS7 (pattern length: $2^7-1$), PRBS9 (pattern length: $2^9-1$), PRBS10 (pattern length: $2^{10}-1$), PRBS11 (pattern length: $2^{11}-1$), PRBS15 (pattern length: $2^{15}-1$), and PRBS20 (pattern length: $2^{20}-1$), and evaluation patterns for evaluating PAM including PRBS13Q, PRBS31Q, and SSPRQ.

The signal synthesis and output unit 2c adds the most significant bit string signal generated by the first signal generation unit 2a and the least significant bit string signal generated by the second signal generation unit 2b to output the PAM4 signal. The PAM4 signal is input as a test signal of a known pattern to the device under test W in measuring an error rate or the like of the device under test W.

An error that is inserted into the test signal is optional. For example, any FEC Symbol Error is inserted in a case of checking FEC error tolerance of the device under test W. Furthermore, in a case of confirming tolerance of the device under test W, an error is inserted, and in a case where the device under test W confirms an error with any other test signals, an error is not inserted and confirmation is performed with a capture function.

The error detector 3 receives a signal to be output from the device under test W in compliance with the input of the NRZ signal or the PAM4 signal and measures the error rate or the like when the NRZ signal or the PAM4 signal to be reference data is input as the test signal of the known pattern from the signal generator 2 to the device under test W, and as shown in FIG. 1, includes a signal reception unit 3a, a synchronization detection unit 3b, a positional information storage unit 3c, a data comparison unit 3d, and a data storage unit 3e.

In a case where the test signal input to the device under test W is the NRZ signal, the signal reception unit 3a samples the NRZ signal received from the device under test W in a predetermined sampling period to convert the signal into bit string data (data of a bit string having 0 and 1). The bit string data converted by the signal reception unit 3a is input to the synchronization detection unit 3b.

In a case where the test signal input to the device under test W is the PAM4 signal, the signal reception unit 3a samples the PAM4 signal received from the device under test W in a predetermined sampling period to convert the signal into symbol string data (data of a string of symbols having symbol values of 0, 1, 2, and 3). The symbol string data converted by the signal reception unit 3a is input to the synchronization detection unit 3b.

In a case where the test signal input to the device under test W is the NRZ signal, the synchronization detection unit 3b synchronously fetches the reference data that is data of the bit string of the NRZ signal to be a reference read from the storage unit 5 and the bit string data of the NRZ signal received from the device under test W and output from the signal reception unit 3a at a setting timing set in advance by the operation unit 4, and outputs the fetched bit string data to be input data to the data comparison unit 3d.

In a case where the test signal input to the device under test W is the PAM4 signal, the synchronization detection unit 3b synchronously fetches reference data that is data of the symbol string of the PAM4 signal to be a reference read from the storage unit 5 and the symbol string data of the PAM4 signal received from the device under test W and output from the signal reception unit 3a at a setting timing set in advance by the operation unit 4, and outputs the fetched symbol string data to be input data to the data comparison unit 3d.

The setting timing is set in advance by the operation unit 4, for example, on the setting screen (not shown) of the display unit 6, and is a timing at which a trigger signal is generated according to a user's instruction, a timing at which a designated number of FEC Symbol Errors occur in one Codeword length (for example, in a case where one Codeword is 544 FEC Symbols, and the user desires to capture at a timing at which 16 FEC Symbol Errors occur, synchronization is achieved at a timing at which 16/544 FEC Symbol Errors occur), or a timing at which a designated number of FEC Symbol Errors continuously occur (synchronization is achieved at a timing at which a designated number of continuous FEC Symbol Errors occur regardless of a Codeword).

When synchronization is achieved, the synchronization detection unit 3b notifies the data comparison unit 3d that synchronization is achieved, and stores a synchronous position representing a position of a bit or a symbol in the reference data when synchronization is achieved, in the positional information storage unit 3c.

When synchronization of the reference data and the bit string data of the NRZ signal or the symbol string data of the PAM4 signal from the signal reception unit 3a is achieved by the synchronization detection unit 3b, the positional information storage unit 3c stores the synchronous position of the bit or the symbol in the reference data when synchronization is achieved.

In a case where the test signal input to the device under test W is the NRZ signal, the data comparison unit 3d captures a head of one FEC Symbol (10 bits or 20 bits) of the bit string data fetched synchronously with the reference data (test signal) at the setting timing by the synchronization detection unit 3b and compares each bit with error data ("1") to detect errors of each one Codeword length. That is, in a case where the bit of the bit string data is "1", this is detected as an error. The head of one FEC Symbol of the bit string data is detected by making a counter of the data comparison unit 3d run free to assume the head.

In a case where the test signal input to the device under test W is the NRZ signal, the data comparison unit 3d divides the bit string data synchronously with the reference data (test signal) at the setting timing by the synchronization detection unit 3b by one FEC Symbol length (10 bits or 20 bits) and detects a FEC Symbol Error at one FEC Symbol interval. For example, in a case where one FEC Symbol length is 10 bits, the bit string data is divided by 10 bits, and in a case where an error occurs even in one bit within 10 bits, this is detected as one FEC Symbol Error.

In a case where the test signal input to the device under test W is the PAM4 signal, the data comparison unit 3d captures the head of one FEC Symbol (10 bits or 20 bits) of the symbol string data fetched synchronously with the reference data (test signal) at the setting timing by the synchronization detection unit 3b to divide the symbol string data into most significant bit string data (hereinafter, referred to as MSB data) and least significant bit string data (hereinafter, referred to as LSB data) by data division means 3da, and compares each of the MSB data and the LSB data with the error data ("1") to detect each of a most significant bit error (hereinafter, referred to as an MSB error) and a least significant bit error (hereinafter, referred to as an LSB error) of each one Codeword length. That is, in a case where the divided MSB data is "1", this is detected and counted as an MSB error, and in a case where the divided LSB data is "1", this is detected as an LSB error. The head of one FEC Symbol of the symbol string data is detected by making the counter of the data comparison unit 3d run free to assume the head.

In a case where the test signal input to the device under test W is the PAM4 signal, the data comparison unit 3d divides the MSB data and the LSB data by one FEC Symbol length (10 bits or 20 bits), and detects FEC Symbol Errors in each of the MSB data and the LSB data at one FEC Symbol interval. For example, in a case where one FEC Symbol length is 10 bits, the MSB data and the LSB data are divided by 10 bits, and in a case where an error occurs even in one bit within 10 bits, this is detected as one FEC Symbol Error.

In FIG. 1, for convenience of description, although a configuration in which the data comparison unit 3d includes the data division means 3da has been described, the data division means 3da can be configured of a known PAM decoder, for example.

The data storage unit 3e stores comparison result data of the data comparison unit 3d, or the like along with the bit string data or the symbol string data synchronized with the reference data.

The operation unit 4 also functions as setting means, and is configured of, for example, a user interface, such as an operation knob, various keys, switches, or buttons of the error rate measuring apparatus 1 of FIG. 1, or softkeys on a display screen of the display unit 6. The operation unit 4 executes various kinds of setting regarding an error rate measurement, such as setting of the setting timing, designation of a block of the bit string data or the symbol string data displayed on the display screen (the capture screen 6a of FIGS. 3A and 3B) of the display unit 6, setting of baud rate or generation conditions of a bit string or a symbol string, and an instruction to start or end the error rate measurement.

Figure 3A:
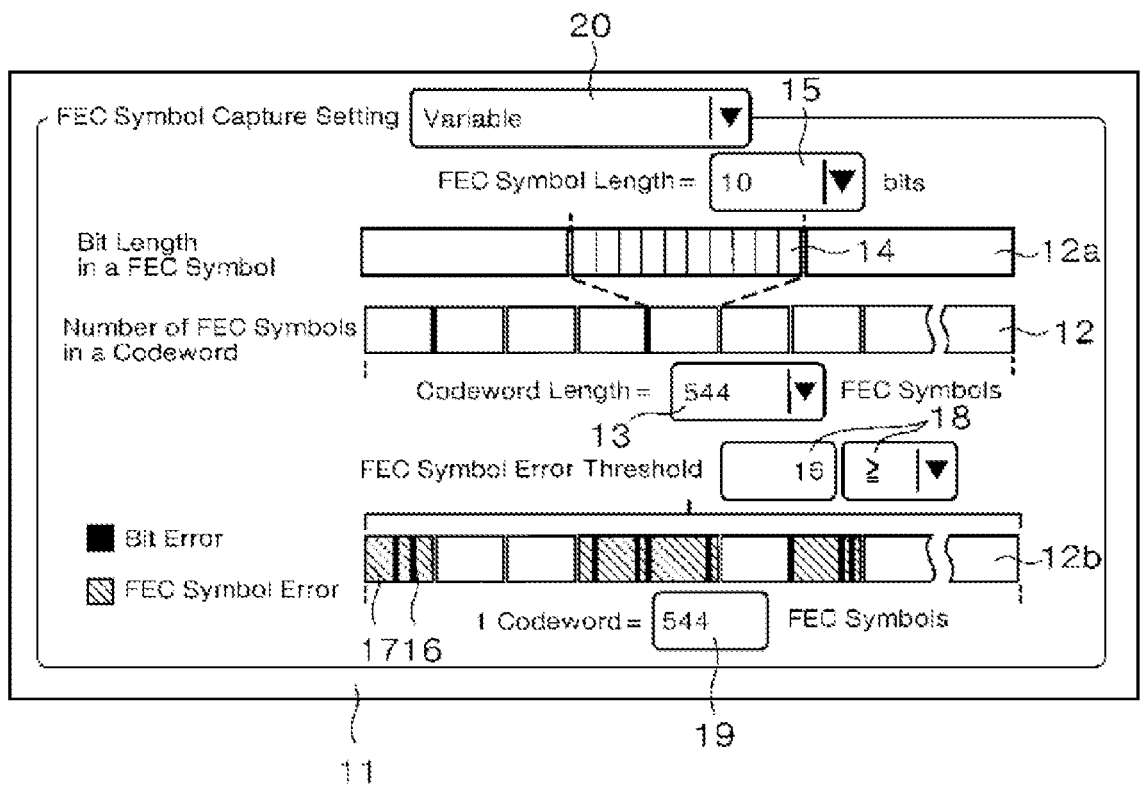
FIGS. 3A and 3B are diagrams showing an example of a setting screen of the error rate measuring apparatus according to the invention.

FIG. 3A shows an example of a setting screen 11 on which setting parameters (one Codeword length, one FEC Symbol length, and a FEC Symbol Error Threshold (a threshold value of FEC Symbol Errors for starting capture) of the FEC) to a signal received from the device under test W are set.

On the setting screen 11 of FIG. 3A, as "Number of FEC Symbols in a Codeword" indicating the length of one Codeword of the FEC, one Codeword is displayed by a violet bar-shaped graphic 12 of which the length is partially omitted and which is sectioned by FEC Symbols.

At a position directly below the graphic 12 of "Number of FEC Symbols in a Codeword", an input box 13 for selecting and setting the number of FEC Symbols forming "Codeword Length" from a pull-down menu is displayed. The setting screen 11 of FIG. 3A shows a state in which "544" is selected and set in the input box 13.

At a position directly above the graphic 12 of "Number of FEC Symbols in a Codeword", "Bit Length in a FEC Symbol" that is indicated as forming a part of a Codeword by a dotted line and is color-coded is displayed by a bar-shaped graphic 14. For example, color-coding display is performed in such a manner that the graphic 14 of the FEC Symbol is blue and portions corresponding to a graphic 12a of the Codeword except for the graphic 14 of the FEC Symbol are violet.

At a position directly above the graphic 14 of "Bit Length in a FEC Symbol", an input box 15 for selecting and setting the number of bits (10 bits or 20 bits) of "FEC Symbol Length" from a pull-down menu is displayed. The setting screen of FIG. 3A shows a state in which "10" is selected and set in the input box 15.

In addition, below the graphic 12 of "Number of FEC Symbols in a Codeword", as an error included on one Codeword, a graphic 16 of "Bit Error" and a graphic 17 of "FEC Symbol Error" are color-coded and displayed in a graphic 12b of one Codeword. For example, color-coding display is performed in such a manner that the graphic 12b of one Codeword is violet, the graphic 16 of "Bit Error" is yellow, and the graphic 17 of "FEC Symbol Error" is red.

At a position directly above the graphic 12b of one Codeword where the graphic 16 of "Bit Error" and the graphic 17 of "FEC Symbol Error" are displayed, an input box 18 for setting a threshold value of "FEC Symbol Error Threshold" using an equality sign (=), an inequality sign with an equality sign (≥) and a numeral is displayed.

At a position directly below of the graphic 12b of one Codeword where the graphic 16 of "Bit Error" and the graphic 17 of "FEC Symbol Error" are displayed, an input box 19 for inputting the number of FEC Symbols forming one Codeword is displayed.

Figure 3B:
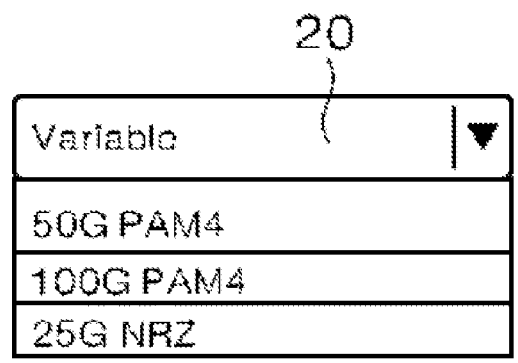

Then, in an upper portion of the setting screen 11 of FIG. 3A, a selection item 20 of "FEC Symbol Capture Setting" is displayed. As shown in FIG. 3B, in regard to the selection item 20 of "FEC Symbol Capture Setting", selection items of settings according to a communication standard of the device under test W are displayed in a pull-down menu. In an example of FIG. 3B, "Variable", "50G PAM4", "100G PAM4", and "25G NRZ" are displayed as selection items in a pull-down menu.

FIG. 3A shows a state in which "Variable" is selected as the selection item 20 of "FEC Symbol Capture Setting". In the state in which "Variable" is selected, it is possible to allow free selection and input to each input box from the pull-down menu.

In the example of FIG. 3A, "50G PAM4", "100G PAM4", and "25G NRZ" can be selected as the selection item 20 of a preset setting, and in a case where any preset setting is selected, respective parameters based on a communication standard of the selected preset setting is automatically set.

For example, in a case where "50G PAM4" is selected as the preset setting, the respective parameters are automatically set in such a manner that the Codeword length is "544", the FEC Symbol length is "10", and the FEC Symbol Error Threshold is "16".

Furthermore, in a case where "100G PAM4" is selected as the preset setting, the respective parameters are automatically set in such a manner that the Codeword length is "272", the FEC Symbol length is "20", and the FEC Symbol Error Threshold is "16".

In addition, in a case where "50G NRZ" is set as the preset setting, the respective parameters are automatically selected in such a manner that the Codeword length is "528", the FEC Symbol length is "10", and the FEC Symbol Error Threshold is "8".

In this way, on the setting screen 11 of FIG. 3A, a configuration relationship of the FEC Symbol to one Codeword and a correspondence relationship of the FEC Symbol Error to one Codeword are graphically displayed in an identifiable manner. With this, it is possible to allow the user to set the respective parameters of the FEC to the signal received from the device under test W after visually recognizing the configuration relationship or the correspondence relationship of "Number of FEC Symbols in a Codeword", "Bit Length in a FEC Symbol", "Bit Error", and "FEC Symbol Error" even though the user is not an expert who knows the communication standard of the device under test W.

On the setting screen 11 of FIG. 3A, although a case where "Bit Length in a FEC Symbol", and "Bit Error" and "FEC Symbol Error" are vertically arranged centering on "Number of FEC Symbols in a Codeword" and are graphically displayed has been shown such that the configuration relationship of "Number of FEC Symbols in a Codeword", "Bit Length in a FEC Symbol", "Bit Error", and "FEC Symbol Error" is easily visually recognized, the invention is not limited to this arrangement. For example, "Bit Length in a FEC Symbol", and "Bit Error" and "FEC Symbol Error" may be reversely arranged or "Bit Length in a FEC Symbol", and "Bit Error" and "FEC Symbol Error" may be arranged above or below "Number of FEC Symbols in a Codeword" and may be graphically displayed.

The storage unit 5 stores symbol data fetched from the signal reception unit 3a in units of blocks at the setting timing set in advance with a storage capacity allocated in advance under the control of the control unit 7. In the embodiment, a mass of symbol string data that can be displayed in one display region (a display size including scroll display) of the display unit 6 is defined as one block. For example, in a case where the storage capacity to be allocated is 8 Mbits (corresponding to 4 Msymbols of symbol string data) and a mass of symbol string data that can be displayed in one display region of the display unit 6 is defined as one block, 1 block=65536 bits=32768 symbols, the symbol string data of 4 Msymbols is divided into a predetermined number of divisions (any number of divisions of 1, 2, 4, 8, 16, 32, 64, and 128) set in advance is and stored in the storage unit 5.

A maximum number of divisions of the symbol string data is determined according to the storage capacity allocated to the storage unit 5. For example, in a case where the storage capacity allocated to the storage unit 5 is 8 Mbits, the maximum number of divisions of the symbol string data is 128.

The storage unit 5 stores a bit string of the NRZ signal or a symbol string of the PAM4 signal (a string of symbols having symbol values of 0, 1, 2, and 3) input to the device under test W as a test signal of a known pattern from the signal synthesis and output unit 2c. The bit string of the NRZ signal or the symbol string of the PAM4 signal input to the device under test W as the test signal of the known pattern is reference data to be a reference for comparison with input data that is generated from the signal received from the device under test W.

The storage unit 5 stores a counting result of error counting means 7a described below of the control unit 7. In addition, the storage unit 5 stores information regarding the setting timing, the baud rate, the generation conditions of the bit string or the symbol string, and the like. Such information can be appropriately selected and set by the operation unit 4 through the user interface.

A configuration may be made in which, in a case where the control unit 7 or the signal generator 2 can recognize the bit string of the NRZ signal or the symbol string of the PAM4 signal to be the test signal, the bit string of the NRZ signal or the symbol string of the PAM4 signal that is the test signal of the known pattern, that is, the reference data is stored from the control unit 7 or the signal generator 2 to the storage unit 5.

The display unit 6 is configured of, for example, a liquid crystal display or the like in the error rate measuring apparatus 1 of FIG. 1, and displays the setting screen regarding an error rate measurement, each compliance test (a test about whether or not the device under test W conforms to the communication standard) including the error rate measurement, the capture screen, and the like under the control of display control means 7b described below. The display unit 6 also has an operation function of the operation unit 4, such as softkeys on the display screen.

The display unit 6 displays a capture screen 21 in a display form shown in FIG. 4 in addition to the setting screen 11 of FIG. 3A under the control of the display control means 7b described below.

Figure 4:
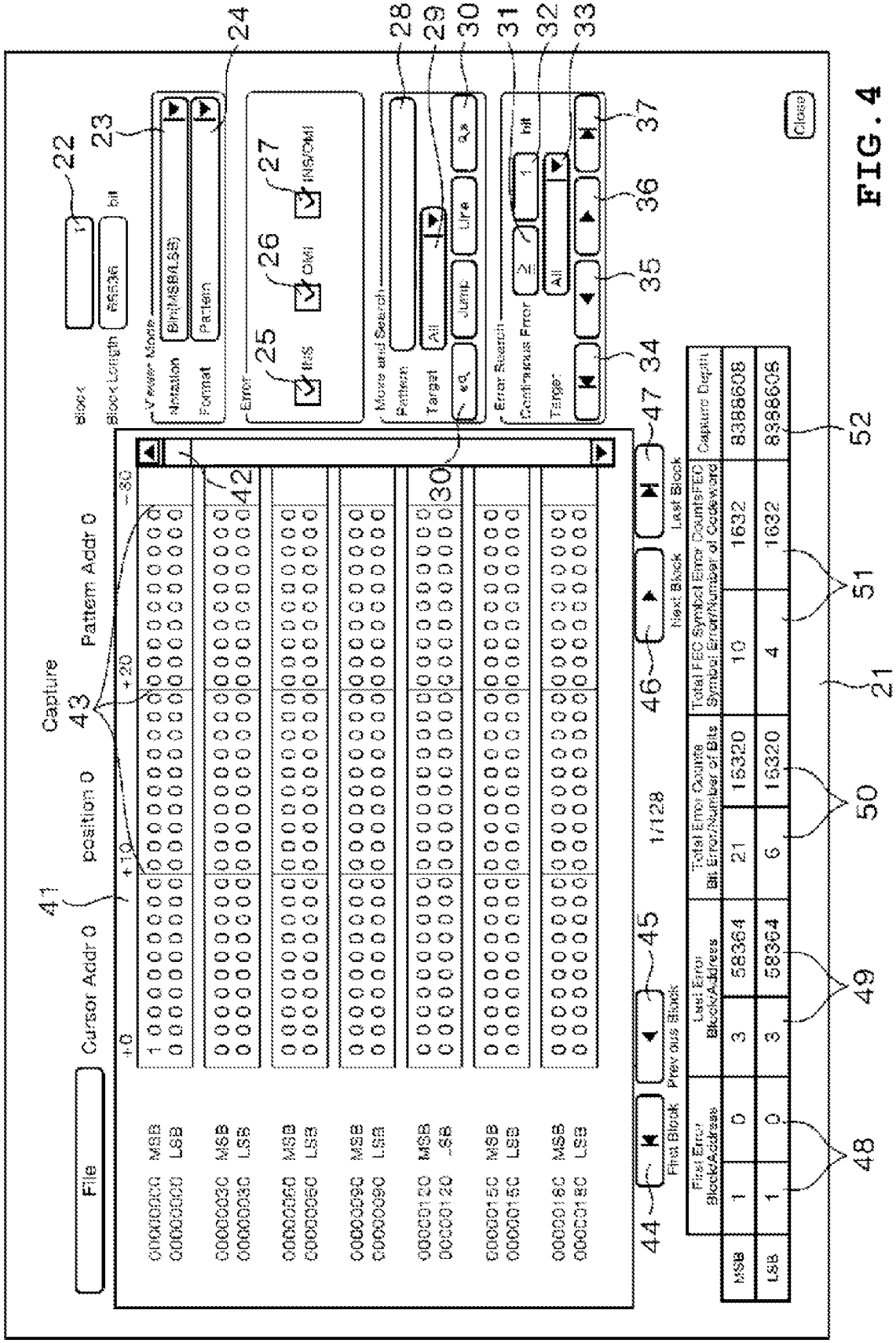
FIG. 4 is a diagram showing an example of a capture screen when data is divided and displayed in units of 30 bits in the error rate measuring apparatus according to the invention.

FIG. 4 shows an example of the capture screen 21 of the display unit 6. In a region of an upper right portion of the capture screen 21 of FIG. 4, "Block" and "Block Length" are displayed. In "Block", an input box 22 for inputting a numerical value indicating what number of block are the MSB data and the LSB data displayed on the capture screen 21 is displayed. In "Block Length", a size (length) of data for one block is displayed. The example of FIG. 4 shows a state in which "1" is input to the input box 22 of "Block" and "Block Length" is displayed as "65536" bit. In the input box 22 of "Block", the numerical value up to the number of divisions (for example, 1 to 128) of the block determined according to the storage capacity of the storage unit 5 can be set and input.

In a region below "Block Length" of the capture screen 21, "Viewer Mode" (viewing mode) that is used for the purpose of debugging is displayed. In "Notation" of "Viewer Mode", an input box 23 that designates notation of data ("Bin (MSB/LSB), "Bin" (NRZ mode only), "Hex" (NRZ mode only), and "Symbol" (PAM4 mode only)) of data displayed on the capture screen 21 is displayed. In "Format" of "Viewer Mode", an input box 24 that designates a display format ("Pattern" (only pattern data of symbol value display), "Pattern+Waveform" (waveform image display with, for example, a blue line is performed on the pattern data of the symbol value display)) of data on the capture screen is displayed. The notation and the display format of data are selected and set from respective pull-down menus. The example of FIG. 4 shows a state in which "Bin (MSB/LSB)" is selected from the pull-down menu of the input box 23 of "Notation", and "Pattern" is selected from the pull-down menu of the input box 24 of "Format".

In a region below "Viewer Mode" of the capture screen 21, "Error" is displayed. In "Error", check boxes 25, 26, and 27 for color-coding display of bits with an error are displayed according to a transition state. The example of FIG. 4 shows a state in which the check box 25 of "INS" for displaying a bit in red in a case where there is an insertion error (0→1), the check box 26 of "OMI" for displaying a bit in yellow in a case where there is an omission error (1→0), and the check box 27 of "INS/OMI" for displaying bits in blue in a case where there are both the insertion error (0→1) and the omission error (1→0) among eight bits in Hex display.

In a region below "Error" of the capture screen 21, "Move and Search" for searching for a specific pattern is displayed. A specific pattern to be searched is input to an input box 28 of "Patten" of "Move and Search", a pattern to be searched (any of MSB, LSB, and All) is selected and set from a pull-down menu in an input box 29 of "Target", and successive search is performed by a magnifier button 30.

Figure 5:
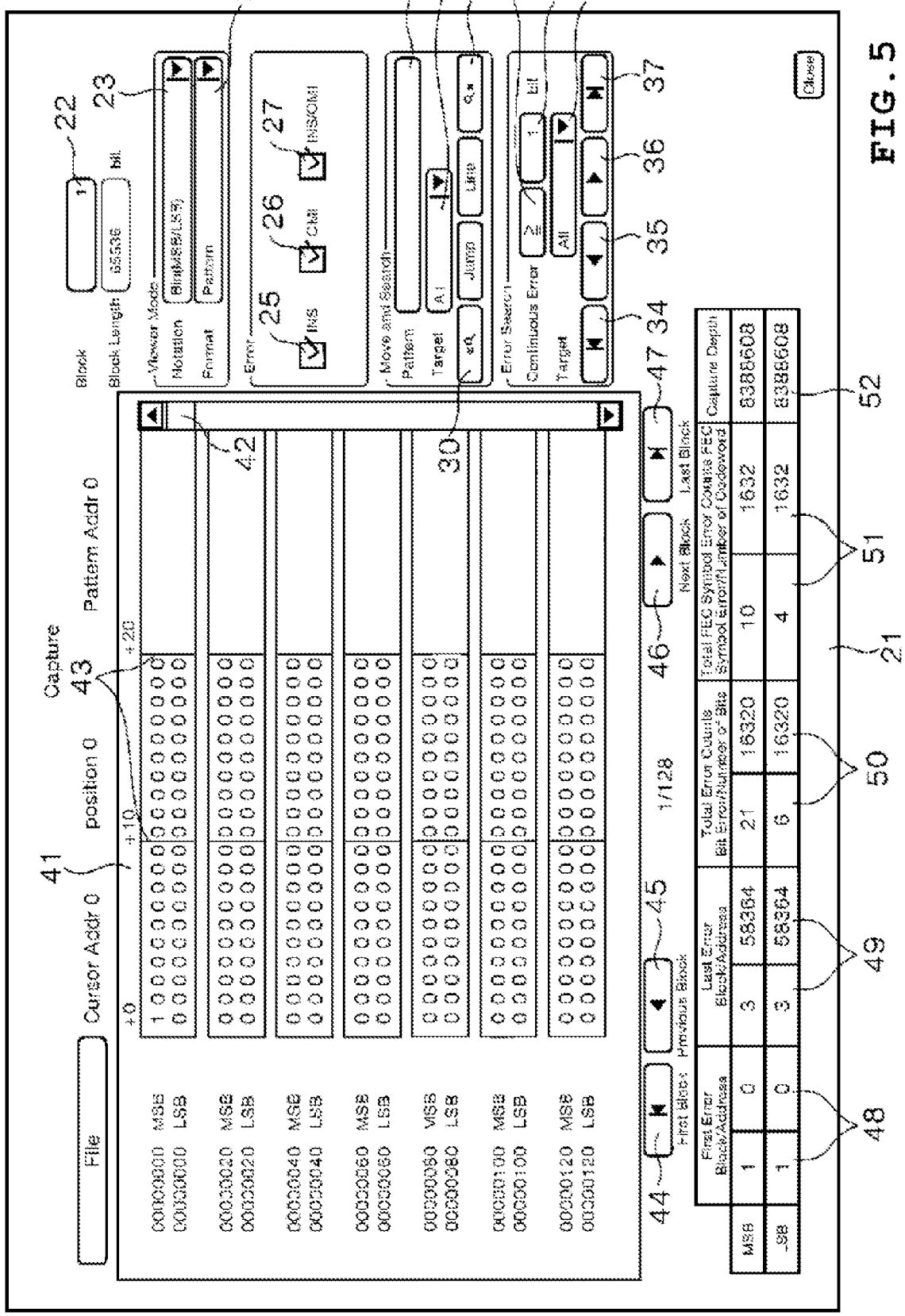
FIG. 5 is a diagram showing an example of a capture screen when data is divided and displayed in units of 20 bits in the error rate measuring apparatus according to the invention.

In a region below "Move and Search" of the capture screen 21, "Error Search" for performing continuous error search is displayed. In "Error Search", "Continuous Error" and "Target" for setting data to be searched and the number of errors as error search conditions are displayed. In "Continuous Error", input boxes 31 and 32 for setting the number of errors using an equality sign (=), an inequality sign with an equality sign (≥) and a numeral are displayed. In "Target", an input box 33 for selecting and setting data to be searched (any of MSB, LSB, and All) from a pull-down menu is displayed. The example of FIG. 4 or 5 shows a state in which, as the error search conditions, "≥" is input to the input box 31, "3" is input to the input box 32, and "All" (full range) is input to the input box 33, and FEC Symbol Errors that are continuous in three bits or more are searched in all data.

In a region below "Target", a softkey 34 for moving a cursor on the capture screen 21 to a position of a first error bit, a softkey 35 for moving the cursor on the capture screen 21 to a position of a previous error bit, a softkey 36 for moving the cursor on the capture screen 21 to a position of a next error bit, and a softkey 37 for moving the cursor on the capture screen 21 to a position of a last error bit are displayed.

In a data display region 41 on a left side of "Block Length" of the capture screen 21, the MSB data and the LSB data of each symbol of the symbol string data for one block based on the input data are vertically arranged in a pair and displayed with the vertical axis on the display as an address and the horizontal axis as a bit. The example of FIG. 4 shows a state in which the MSB data and the LSB data vertically arranged in a pair and displayed form data of one symbol, and in a state in which the MSB data and the LSB data for 30 symbols are vertically arranged in a row, the MSB data and the LSB data of the symbols for seven rows are vertically arranged in the respective rows and displayed in the data display region 41.

The MSB data and the LSB data not displayed in the data display region 41 can be displayed in the data display region 41 and confirmed using a scroll bar 42 on a right side.

In the data display region 41 where the MSB data and the LSB data of each symbol are displayed, a section line 43 is displayed by each one FEC Symbol length set by the operation unit 4. The example of FIG. 4 shows a state in which one FEC Symbol length is set to 10 bits by the operation unit 4, and the section line 43 is displayed by 10 bits.

In addition, the MSB data and the LSB data of each symbol can also be subjected to a line break and displayed by FEC Symbols set by the operation unit 4. For example, in a case where the FEC Symbol length is set to 20 bits, as shown on the capture screen 21 of FIG. 5, the MSB data and the LSB data of each symbol of the symbol string data are subjected to a line break by 20 bits and displayed. On the capture screen 21 of FIG. 5, the same components as those shown in FIG. 4 are represented by the same numbers.

Below the data display region 41 on the capture screen 21, a softkey 44 that gives an instruction to display MSB data and LSB data of a first block in the data display region 41, a softkey 45 that gives an instruction to display MSB data and LSB data of a previous block in the data display region 41, a softkey 46 that gives an instruction to display MSB data and LSB data of a next block in the data display region 41, and a softkey 47 that gives an instruction to display MSB data and LSB data of a last block in the data display region 41 are displayed.

In a region of a low portion of the capture screen 21, as a result of error counting, "First Error Block/Address", "Last Error Block/Address", "Total Error Counts Bit Error/Number of Bits", "Total FEC Symbol Error Counts FEC Symbol Error/Number of Codeword", "Capture Depth" are displayed. In a display box 48 of "First Error Block/Address", a block and an address of a location where an error occurs first are displayed. In a display box 49 of "Last Error Block/Address", a block and an address of a location where an error occurs at last are displayed. In a display box 50 of "Total Error Counts Bit Error/Number of Bits", the total number of bit errors counted in total and the total number of bits are displayed. In a display box 51 of "Total FEC Symbol Error Counts FEC Symbol Error/Number of Codeword", the number of FEC Symbol Errors and the number of Codewords at the set FEC Symbol length are counted and displayed. In a display box 52 of "Capture Depth", the number of bits acquired by capture is displayed.

The control unit 7 is configured of a central processing unit (CPU) and a storage element, such as a read only memory (ROM) or a random access memory (RAM), to measure an error rate of the PAM4 signal, integrally controls the signal generator 2, the error detector 3, the operation unit 4, the storage unit 5, and the display unit 6, and includes the error counting means 7a and the display control means 7b.

In a case where the test signal input to the device under test W is the NRZ signal, the error counting means 7a counts errors detected by the data comparison unit 3d (including counting Codewords) and counts the FEC Symbol Errors detected at one FEC Symbol interval.

In a case where the test signal input to the device under test W is the PAM4 signal, the error counting means 7a counts MSB errors and LSB errors detected by the data comparison unit 3d (including counting Codewords) and counts FEC Symbol Errors detected at one FEC Symbol interval.

The display control means 7b controls display on the display screen of the display unit 6, for example, the setting screen 11 of FIG. 3A or the capture screen 21 of FIG. 4 or 5.

Next, as an example of a processing operation of error counting of the error rate measuring apparatus 1 configured as above based on the setting according to the setting screen 11 of FIG. 3A, cases classified based on whether the test signal input to the device under test W is the NRZ signal or the PAM4 signal will be described referring to FIGS. 6 and 7.

Case of NRZ Signal

Figure 6:
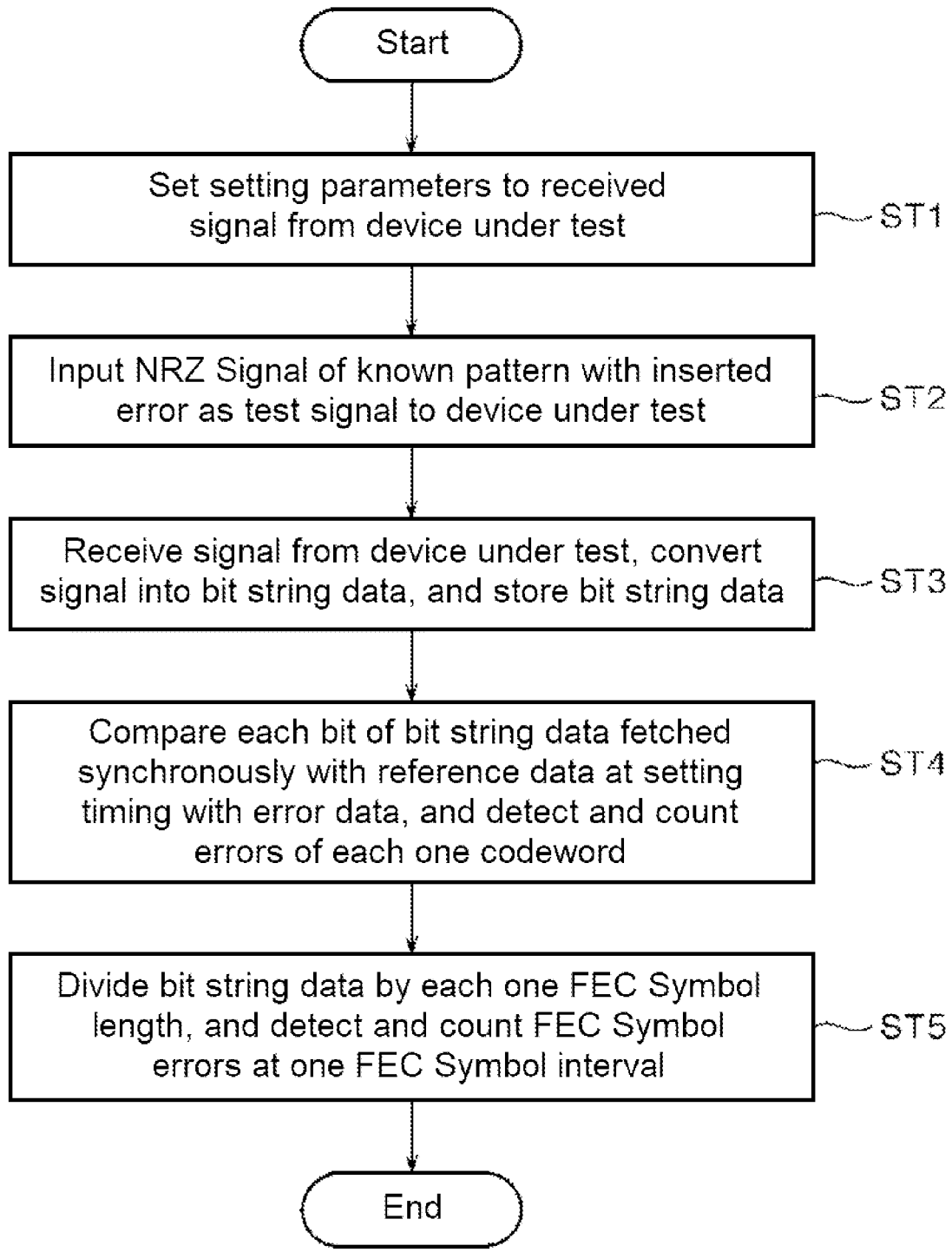
FIG. 6 is a flowchart of a processing operation of error counting based on parameter settings in a case where an NRZ signal is input to a device under test in the error rate measuring apparatus according to the invention.

As shown in FIG. 6, first, the setting parameters to the received signal from the device under test W are set by the operation unit 4 (ST1). Specifically, on the setting screen 11 of FIG. 3A, one Codeword length, one FEC Symbol length, and the FEC Symbol Error Threshold are set based on the communication standard of the device under test W to be measured or the preset setting (for example, 25G NRZ) according to the communication standard of the device under test W is selected and set.

Here, on the setting screen 11 of FIG. 3A, a configuration relationship of the FEC Symbol to one Codeword and a correspondence relationship of the FEC Symbol Error to one Codeword are graphically displayed in an identifiable manner. With this, the user sets respective parameters of the FEC after visually recognizing the configuration relationship or the correspondence relationship of "Number of FEC Symbols in a Codeword", "Bit Length in a FEC Symbol", "Bit Error", and "FEC Symbol Error".

After the above-described setting ends, the NRZ signal (25G NRZ or the like conforming to the setting parameters) of the known pattern with an inserted error is input as the test signal to the device under test W by the signal generator 2 (ST2).

Then, a signal returned from the device under test W in compliance with the input of the test signal to the device under test W is received and converted into bit string data by the signal reception unit 3a, and the converted bit string data is stored in the storage unit 5 (ST3).

Next, the head of one FEC Symbol (10 bits or 20 bits) of the bit string data fetched from the storage unit 5 synchronously with the reference data (test signal) at the setting timing is captured, each bit is compared with error data ("1") by the data comparison unit 3d to detect errors of each one Codeword length, and the detected errors of each one Codeword length are counted by the error counting means 7a (ST4). In this case, the number of Codewords is counted. The head of one FEC Symbol of the bit string data is detected by making a counter of the data comparison unit 3d run free to assume the head.

Subsequently, the bit string data is divided by each one FEC Symbol length, FEC Symbol Errors are detected at one FEC Symbol interval, and the detected FEC Symbol Errors are counted by the error counting means 7a (ST5). For example, in a case where one FEC Symbol length is 10 bits, the bit string data is divided by 10 bits, and in a case where an error occurs even in one bit within 10 bits, this is detected and counted as one FEC Symbol Error. Then, a result counted by the error counting means 7a is displayed on, for example, the capture screen 21 of FIG. 4 or 5 under the control of the display control means 7b.

Case of PAM4 Signal

Figure 7:
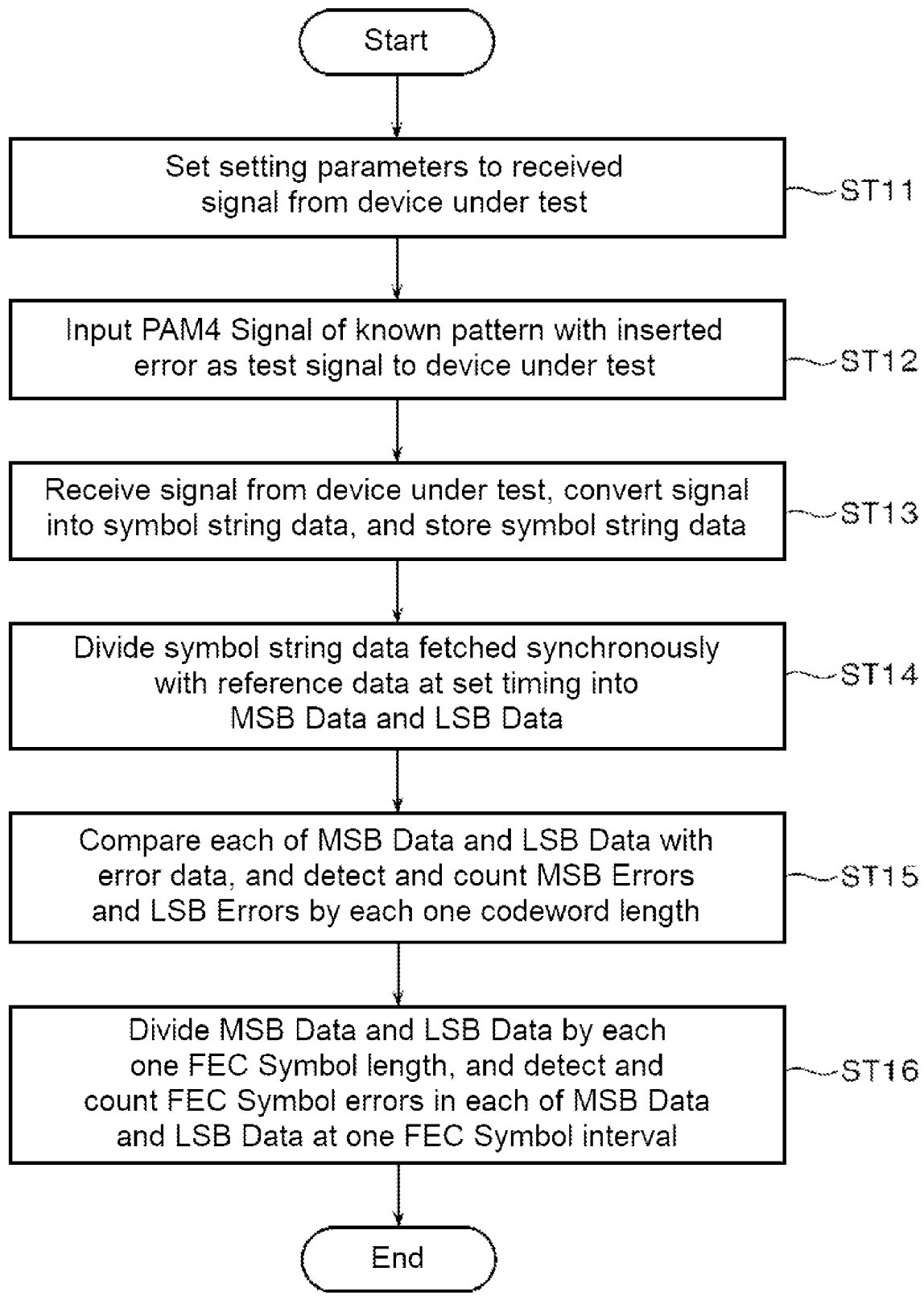
FIG. 7 is a flowchart of a processing operation of error counting based on parameter settings in a case where the PAM4 signal is input to the device under test in the error rate measuring apparatus according to the invention.

As shown in FIG. 7, first, the setting parameters to the received signal from the device under test W are set by the operation unit 4 (ST11). Specifically, on the setting screen 11 of FIG. 3A, one Codeword length, one FEC Symbol length, and the FEC Symbol Error Threshold are set based on the communication standard of the device under test W to be measured or the preset setting (for example, 50G PAM4) according to the communication standard of the device under test W is selected and set.

Here, on the setting screen 11 of FIG. 3A, a configuration relationship of the FEC Symbol to one Codeword and a correspondence relationship of the FEC Symbol Error to one Codeword are graphically displayed in an identifiable manner. With this, the user sets respective parameters of the FEC after visually recognizing the configuration relationship or the correspondence relationship of "Number of FEC Symbols in a Codeword", "Bit Length in a FEC Symbol", "Bit Error", and "FEC Symbol Error".

After the above-described setting ends, the PAM4 signal (for example, 50G PAM4 conforming to the setting parameters) of the known pattern with an inserted error is input as the test signal to the device under test W by the signal generator 2 (ST12).

Then, a signal returned from the device under test W in compliance with the input of the test signal to the device under test W is received and converted into symbol string data by the signal reception unit 3a, and the converted symbol string data is stored in the storage unit 5 (ST13).

Next, the head of one FEC Symbol (10 bits or 20 bits) of the symbol string data fetched from the storage unit 5 synchronously with the reference data (test signal) at the setting timing is captured, and one FEC Symbol is divided into MSB data and LSB data by the data division means 3da (ST14). As described above, the divided MSB data and LSB data are displayed on the capture screen 21, for example, in a display form of FIG. 4 or 5. The head of one FEC Symbol of the symbol string data is detected by making the counter of the data comparison unit 3d run free to assume the head.

Subsequently, each of the MSB data and the LSB data is compared with error data ("1") by the data comparison unit 3d to detect each of MSB errors and LSB errors by one Codeword length, and the MSB errors and the LSB errors of each one Codeword length are counted by the error counting means 7a (ST15). In this case, the number of Codewords is counted.

The error data ("1") is divided into error data for comparing with the MSB data and error data for comparing with the LSB data, in a case where the MSB data is "1", this is detected and counted as an MSB error, and in a case where the LSB data is "1", this is detected and counted as an LSB error.

Then, the MSB data and the LSB data are divided by each one FEC Symbol length, FEC Symbol Errors are detected in each of the MSB data and the LSB data at one FEC Symbol interval, and the detected FEC Symbol Errors are counted by the error counting means 7a (ST16). For example, in a case where one FEC Symbol length is 10 bits, the MSB data and the LSB data are divided by 10 bits, and in a case where an error occurs even in one bit within 10 bits, this is detected and counted as one FEC Symbol Error. Then, a result counted by the error counting means 7a is displayed on, for example, the capture screen 21 of FIG. 4 or 5 under the control of the display control means 7b.

Incidentally, in the above-described embodiment, as shown in FIG. 1, although a configuration is made in which the signal generator 2, the error detector 3, the operation unit 4, the storage unit 5, the display unit 6, and the control unit 7 are included in the error rate measuring apparatus 1, the invention is not limited to this configuration. For example, the signal generator 2 and the error detector 3 can also be separately modularized or may be housed in individual housings, and can also be configured of an external apparatus, such as a personal computer to which the operation unit 4 and the display unit 6 are externally connected.

On the setting screen 11 of FIG. 3A, although the graphic 12 of one Codeword, the graphic 12a or 14 of one FEC Symbol, the graphic 12b, 16, or 17 of one Codeword including an error are graphically displayed such that the configuration relationship of the FEC Symbol to one Codeword or the correspondence relationship of the FEC Symbol Error to one Codeword is identifiable, at least one of the graphic 12 of one Codeword, the graphic 12a or 14 of one FEC Symbol, and the graphic 12b, 16, or 17 of one Codeword including an error can also be selectively displayed as needed.

In this way, according to the embodiment, it is possible to allow the user to set the respective parameters (Codeword, FEC Symbol, and FEC Symbol Error Threshold) of the FEC to the signal received from the device under test W after visually recognizing the configuration relationship of the FEC Symbol to the Codeword of the FEC or the correspondence relationship of the FEC Symbol Error to the Codeword, specifically, the configuration relationship or the correspondence relationship of "Number of FEC Symbols in a Codeword", "Bit Length in a FEC Symbol", "Bit Error", and "FEC Symbol Error" through the graphic display even though the user is not an expert who knows the communication standard of the device under test W, and to achieve improvement of usability.

Although the best mode of the error rate measuring apparatus and the setting screen display method according to the invention has been described above, the invention is not limited by the description and the drawings according to this mode. That is, it is a matter of course that other modes, examples, operation techniques and the like made by those skilled in the art based on this mode are all included in the scope of the present invention.

DESCRIPTION OF REFERENCE NUMERALS AND SIGNS 1 error rate measuring apparatus
2 signal generator
2a first signal generation unit
2b second signal generation unit
2c signal synthesis and output unit
3 error detector
3a signal reception unit
3b synchronization detection unit
3c positional information storage unit
3d data comparison unit
3da data division means
3e data storage unit
4 operation unit
5 storage unit
6 display unit
7 control unit
7a error counting means
7b display control means
11 setting screen
12, 12a, 12b graphic of Codeword
13,15,18,19,22,23,24,28,29,31,32,33 input box
14 graphic of FEC Symbol 16 graphic of bit Error
17 graphic of FEC Symbol Error
20 selection item
21 capture screen
25, 26, 27 check box
30 magnifier button
34, 35, 36, 37, 44, 45, 46, 47 softkey
41 data display region
42 scroll bar
43 section line
48, 49, 50, 51, 52 display box
W device under test

What is claimed is:

1. An error rate measuring apparatus that inputs a non return to zero (NRZ) signal or a pulse amplitude modulation 4 (PAM4) signal of a known pattern including an error as a test signal to a device under test (W), receives a signal from the device under test compliant with the input of the test signal, and measures whether or not a forward error correction (FEC) operation of the device under test is possible based on a comparison result of the signal received from the device under test and the test signal, the error rate measuring apparatus comprising:
   an operation unit that inputs a setting parameter to the signal received from the device under test; and
   a display unit that displays the setting parameter on a setting screen,
   wherein the display unit displays input boxes for inputting one Codeword length and one FEC Symbol length of the FEC as the setting parameter to the signal received from the device under test on the setting screen,
   the operation unit inputs the one Codeword length and the one FEC Symbol length of the FEC to the corresponding input boxes according to a communication standard of the device under test, and
   at least one of a graphic of one Codeword, a graphic of one FEC Symbol, and a graphic of one Codeword including an error for identifying a configuration relationship of an FEC Symbol to a Codeword of the FEC and a correspondence relationship of an FEC Symbol Error to the Codeword is displayed on the setting screen corresponding to the input box of each of the one Codeword length and the one FEC Symbol length of the FEC.

2. The error rate measuring apparatus according to claim 1,
   wherein a plurality of preset settings, in which the one Codeword length and the one FEC Symbol length of the FEC are set in advance according to the communication standard of the device under test (W), are displayed on the setting screen in a selectable manner, and
   one preset setting is selected and set from among the plurality of preset settings by the operation unit.

3. A setting screen display method for an error rate measuring apparatus that inputs a non return to zero (NRZ) signal or a pulse amplitude modulation 4 (PAM4) signal of a known pattern including an error as a test signal to a device under test (W), receives a signal from the device under test compliant with the input of the test signal, measures whether or not a forward error correction (FEC) operation of the device under test is possible based on a comparison result of the signal received from the device under test and the test signal, inputs a setting parameter to the signal received from the device under test, and displays the setting parameter on a setting screen, the setting screen display method for an error rate measuring apparatus comprising:
   a step of displaying input boxes for inputting one Codeword length and one FEC Symbol length of the FEC as the setting parameter to the signal received from the device under test on the setting screen;
   a step of inputting the one Codeword length and the one FEC Symbol length of the FEC to the corresponding input boxes according to a communication standard of the device under test through the input; and
   a step of displaying at least one of a graphic of one Codeword, a graphic of one FEC Symbol, and a graphic of one Codeword including an error for identifying a configuration relationship of an FEC Symbol to a Codeword of the FEC and a correspondence relationship of an FEC Symbol Error to the Codeword on the setting screen corresponding to the input box of each of the one Codeword length and the one FEC Symbol length of the FEC.

4. The setting screen display method for an error rate measuring apparatus according to claim 3, further comprising:
   a step of displaying a plurality of preset settings, in which the one Codeword length and the one FEC Symbol length of the FEC are set in advance according to the communication standard of the device under test (W), on the setting screen in a selectable manner; and
   a step of selecting and setting one preset setting from among the plurality of preset settings.

* * * * *